United States Patent [19]

Fujii et al.

[11] 4,123,707
[45] Oct. 31, 1978

[54] MAGNETIC FIELD SENSOR HOUSED IN A COOLING DEVICE FOR SENSING THE CHARGE IN A SHAFT FURNACE OR THE LIKE

[75] Inventors: Yoshihiro Fujii; Taketoshi Moriyama, both of Sakai; Yoshikatsu Shigematsu, Kawachi-Nagano; Shinjiro Takeuchi, Toda; Toshiro Kikuchi, Toda; Makio Taguchi, Toda; Satoshi Ichioka, Toda, all of Japan

[73] Assignees: Nippon Steel Corporation, Tokyo; Mishima Kosan Co., Ltd., Kitakyushu, both of Japan

[21] Appl. No.: 739,861

[22] Filed: Nov. 9, 1976

[30] Foreign Application Priority Data

Nov. 11, 1975 [JP] Japan .................... 50-153383[U]

[51] Int. Cl.² .................................... G01R 33/12
[52] U.S. Cl. .................................... 324/208; 75/41; 266/92

[58] Field of Search ............ 324/34 R, 34 D, 34 PS, 324/40, 41, 43 R, 207, 208; 266/92, 93; 75/60, 41

[56] References Cited

U.S. PATENT DOCUMENTS 4,027,233  5/1977  Shmakov et al. ............... 324/34 R

OTHER PUBLICATIONS

Japanese Published Application, #3,570–1973; Jan. 17, 1973.

Primary Examiner—Robert J. Corcoran

[57] ABSTRACT

A magnetic field sensor housed in a cooling device has an inner core body for measuring the behavior of a charge put in a shaft furnace, an inner casing for accommodating the inner core body therein, and an outer casing for accommodating the inner casing with a space for a circulating path of cooling medium therebetween. The inner core body consists of an exciter for exciting the charge put in the furnace, a magnetic field sensing member arranged in front of the exciter for detecting the exciting magnetic field generated from the exciter and a driving circuit arranged at the rear of the exciter for driving the sensing member.

4 Claims, 10 Drawing Figures

MAGNETIC FIELD SENSOR HOUSED IN A COOLING DEVICE FOR SENSING THE CHARGE IN A SHAFT FURNACE OR THE LIKE

BACKGROUND OF THE INVENTION

Field of the Invention

The present invention relates to a magnetic field sensor housed in a cooling device for precisely measuring the behavior of a charge such as iron ore or the like in a shaft furnace or the like by means of a magnetometer arranged on the wall surface of the furnace or the like.

SUMMARY OF THE INVENTION

An object of the present invention is to provide a magnetic field sensor housed in a cooling device for obtaining quantitative information with respect to the behavior of a charge in a shaft furnace.

The magnetic field sensor housed in a cooling device according to the present invention comprises an inner core body consisting of an exciter for exciting a charge in a shaft furnace, a magnetic field sensing member arranged in front of the exciter for detecting the exciting magnetic field generated from the exciter and a driving circuit arranged at the rear of the exciter for driving the magnetic field sensing member. The inner core body is arranged in an inner case and an outer case is provided in spaced relation therearound so as to provide a space to circulate and flow a cooling medium between both the inner and outer cases, whereby a charge such as iron ore or the like in a furnace or the like is magnetized by means of the exciter, changes of the vector component of the excitation magnetic field in the axial direction of the exciter is detected by a drop of the charge in field detection by the magnetic field sensing member arranged at the top of the core body, and behaviors of the charge is precisely measured without the measurements being disturbed by heat or the like from the furnace.

DESCRIPTION OF THE PREFERRED EMBODIMENT

Figure 1:
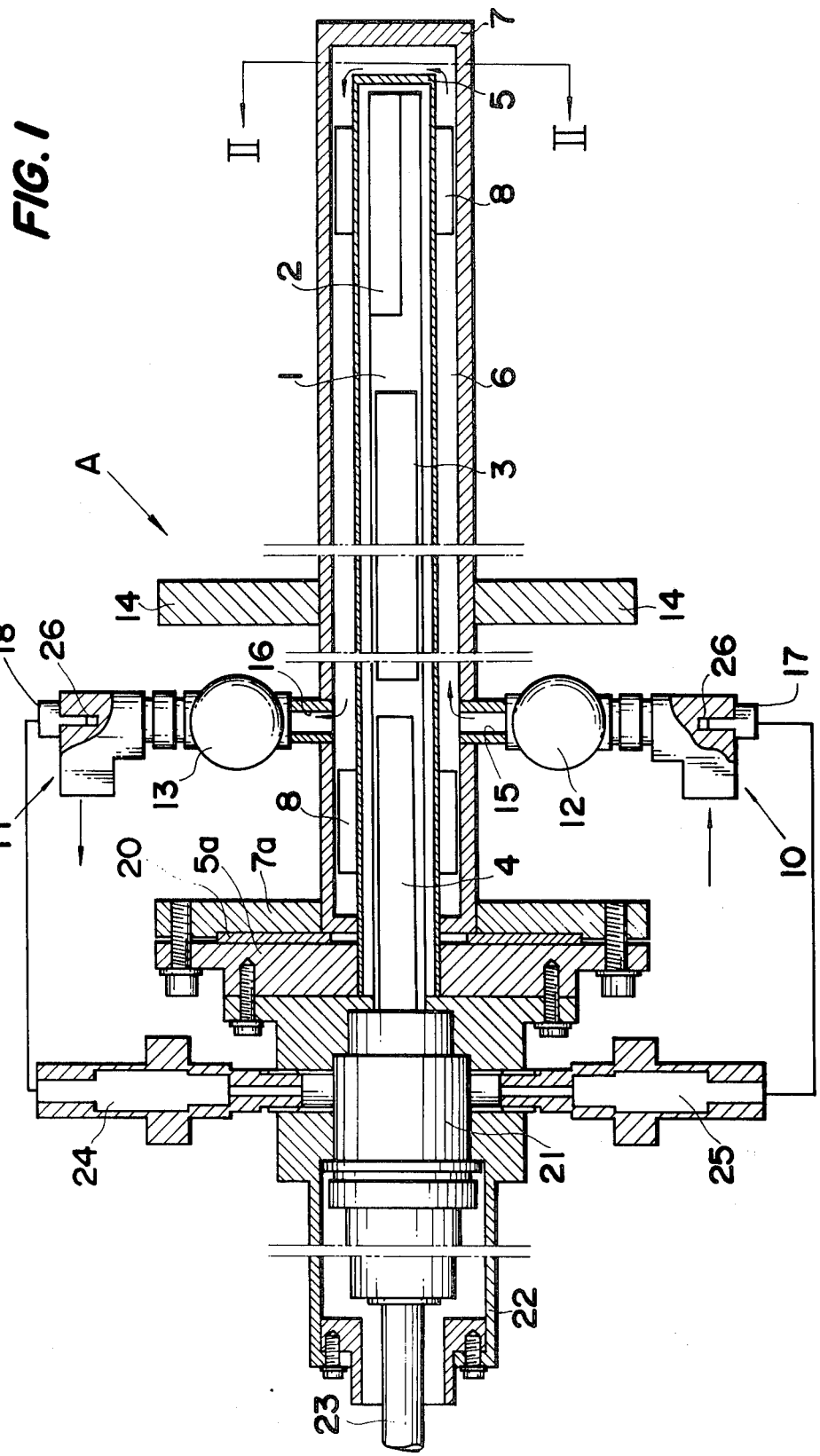
FIG. 1 is a cross-sectional front view showing one embodiment of a magnetic field sensor according to the present invention.

Referring to FIG. 1, there is shown at A one embodiment of a magnetic field sensor housed in a cooling device according to the present invention. The magnetic field sensor has an inner core body 1. This inner core body 1 has therein a magnetic field sensing member 2, an exciter 3 and a driving circuit 4 for the magnetic field sensing member 2 in series from the outer end to the inner end.

The exciter 3 generates an exciting magnetic field to magnetize a charge in a shaft furnace. As such an exiter there can be used, for example, exciting coils and a combination of a magnetic core and an exciting coil (in these cases, the current flowing through the exciting coil for generating the exciting magnetic field may be a direct current or an alternating current), but in the present embodiment there is used a permanent magnet which is easy to construct and which performs well in practice.

The magnetic field sensing member 2 is arranged at the outer end of the inner core body 1 outwardly of the permanent magnet exciter 3 to detect a change in the magnetic field which will be disturbed by a drop of a charge in the shaft furnace, and is a magnetometer having a driving circuit 4 arranged inwardly of the permanent magnet exciter 3 for driving the magnetic field sensing member 2.

As such magnetometers, there can be used flux gate magnetometers, Hall elements, SMD, magnetic reluctance elements, search coil systems, and any other known magnetic field detecting elements, but in the present embodiment there is used a magnetic oscillation type magnetometer utilizing a magnetic oscillation phenomenon produced by a transistor and a magnetic core.

The inner core body 1 has a recess (not shown) for engaging the magnetic field sensing member 2, the permanent magnet exciter 3 and the driving circuit 4, and at the rear portion of the inner core body 1 is provided a connector 21.

Reference numeral 5 designates an inner casing for accommodating the inner core body 1 therein, and an outer casing 7 is provided around the outside of the inner casing 5, and a space 6 is between the inner and outer casing 5 and 7.

Further, the material of both casings 5 and 7, can be a non-magnetic material (for example, stainless steel (SuS304, etc.)), copper and the like, but the present embodiment uses stainless steel.

Reference numeral 8 designates fixed plates, and a plurality of pairs of the fixed plates 8 are provided on the outer peripheral surface of the inner casing 5. In the present embodiment there is a pair of fixed plates 8 at each end of the inner casing 5, and these pairs of fixed plates 8 are used for positioning the inner casing 5 within the outer casing 7 to prevent any movement of the inner casing 5 within the space 6.

Reference numeral 10 designates a cooling medium injecting pipe inserted into a cooling medium injecting inlet 15 in the outer casing 7, and by this pipe cooled water is supplied into the space 6 between the casings 5 and 7 through a flow control valve 12 in pipe 10.

Reference numeral 11 designates a cooling medium exhaust pipe inserted into a cooling medium exhaust outlet 16 in the outer casing 7 for exhausting the cooled medium from within the space 6 through a flow control valve 13 in pipe 11.

Further, cooling mediums which can used in the present invention, are known cold gaseous mediums such as air, nitrogen and the like or a cold liquid medium such as water, oil, a cooling agent or the like depending on the furnace wall temperature and that of the ambient atmosphere.

Figure 2:
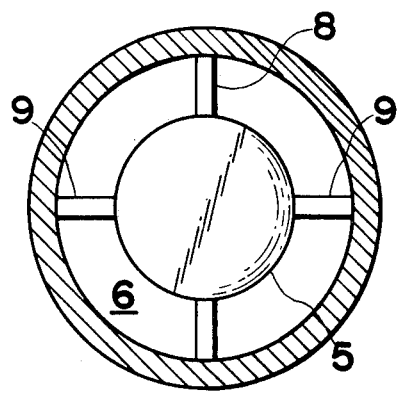
FIG. 2 is a sectional view on an enlarged scale taken along the line II—II of FIG. 1.

Reference numeral 9 designates partition plate provided in the space 6 between the casings 5 and 7, and as shown in FIG. 2, the partition plate 9 has the same length as that of the inner casing 5 and is horizontally positioned in the space 6, so that by means of the partition plate 9 the cooling medium flowing in the space from the injection pipe 10 flows from the lower portion to the upper portion of the space 6 and flows out of the exhaust pipe 11 for constantly and uniformly cooling the inner and outer casings 5 and 7.

Figure 4:
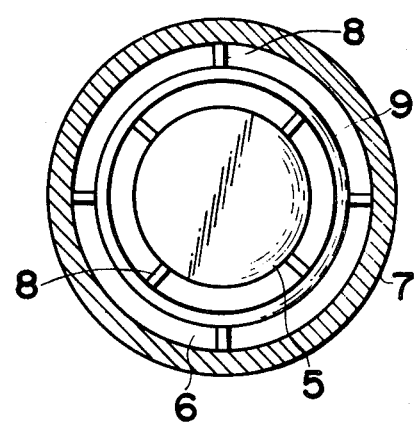
FIG. 4 is a sectional view similar to FIG. 2 showing another embodiment of the sensor according to the present invention.

While the partition plate 9 can be constructed as shown in FIGS. 1 and 2, it can also be formed without any problem as shown in FIG. 4 wherein the partition plate is formed as a cylinder for enclosing the inner casing 5, and the fixed plate 8 are elongated or interposed at a proper position and fixed to both the inner and outer casings 5 and 7.

Reference numeral 14 designates a flange. The flange 14 is provided at a predetermined position outwardly of the cooling medium injecting pipe 10 and the exhaust pipe 11 on the outer peripheral surface of the outer casing 7, and for securing the magnetic sensor A according to the present invention to the shaft furnace wall, the front portion of this flange 14 is embedded in the shaft furnace wall and the flange 14 is fixedly secured to the housing of the shaft surface.

Reference numeral 20 designates a packing material interposed between flanges 5a and 7a on the inner ends of inner and outer casings 5 and 7 which flanges are connected by bolts. A cover 22 is provided for the connector 21, and 23 designates a cord.

Further, 24 and 25 designate connectors provided on the upper and lower sides of the magnetic sensor A according to the present invention and which are connected to cooling medium temperature detecting elements 17 and 18 mounted in a predetermined positions in the cooling medium injecting pipe 10 and the cooling medium exhaust pipe 11.

Figure 3:
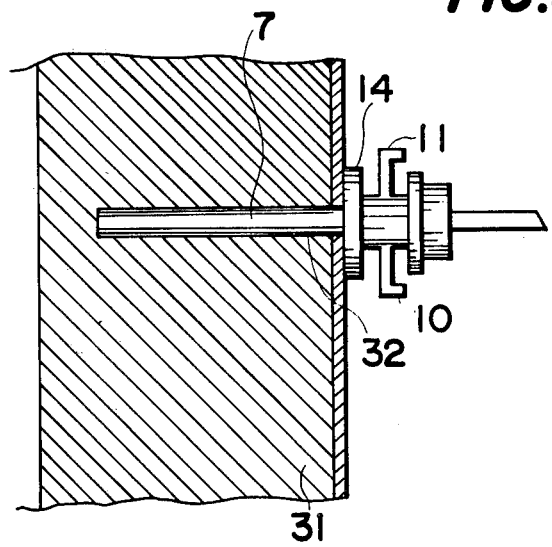
FIG. 3 is a cross-sectional view showing the attachment of the sensor according to the present invention to a furnace.

To mount the above described construction, as shown in FIG. 3, a hole 32 is horizontally into the housing 30 and the brick wall 31 of a shaft furnace toward the furnace center, and the sensor A according to the present invention is inserted into the hole 32 and fixed to the housing 30 by the flange 14.

Thus, the dropping speed, the layer thickness, the distribution conditions in the vertical and circumferential directions and the like of the charge such as iron ore, which items change every moment during operation of the shaft furnace, are detected by a change of the exciting magnetic field generated from the permanent magnet exciter 3, measured by the magnetic field sensing member 2 and observed. Further, during measurement, the cooling medium is constantly supplied to the space 6 between the inner and outer casings 5 and 7 so that the measurement is affected by the heat from the shaft furnace, and in order to secure uniformity of the cooling effect, the temperature detecting elements 17 and 18 are provided in both the injection and exhaust pipes 10 and 11, respectively.

Figure 5A:
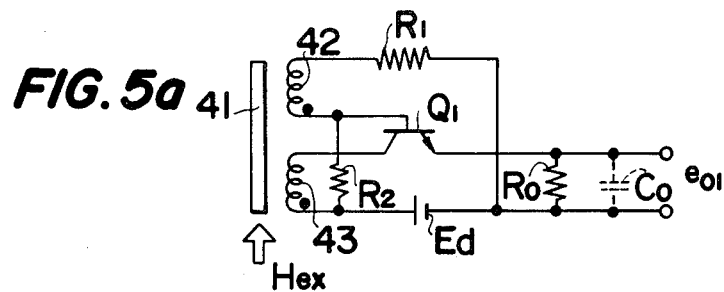
FIGS. 5a to 5d are circuit diagrams showing fundamental circuit arrangements of a magnetic oscillation type magnetometer used in the sensor according to the present invention.

With reference to FIGS. 5a to 5d, there are shown circuits of a magnetic oscillation type magnetometer used in the magnetic sensor according to the present invention. The magnetometer comprises a single transistor, a magnetic core, two windings and a D.C. supply source. FIG. 5a is an embodiment using a NPN type transistor. Reference numeral 41 is a straight magnetic core, on which coils 42 and 43 are wound. One end of the coil 42 is connected to a resistor $R_1$ and the resistor $R_1$ is further connected to a negative terminal of a direct current supply source Ed. The other end of the coil 42 is connected to the base electrode of a transistor $Q_1$ and to one end of a resistor $R_2$ connected to the positive terminal of the direct current supply source Ed. The coil 43 is inserted between the collector electrode of the transistor $Q_1$ and the positive terminal of the direct current supply source. Further, between the emitter electrode of the transistor $Q_1$ and the negative terminal of the direct current supply source is inserted a resistor $R_0$, and an oscillation current flowing through this resistor $R_0$ is derived as an output voltage $e_{01}$. In addition, a direct current mean value of the oscillation current can be derived from the terminal voltage $E_{01}$ of a capacitor $C_0$ connected in parallel with the resistor $R_0$.

Next, the oscillatory operation will be explained with reference to the circuit. It is apparent that the flux level of the reactor 41 is defined by an external magnetic field $H_{ex}$. Therefore, when the voltage of the supply source Ed is applied to the transistor $Q_1$, a current flows through the elements Ed $\oplus \to R_2 \to Q_1 \to R_0 \to$ Ed $\ominus$. A collector current of $Q_1$ begins to flow due to this current and a voltage is induced in the coil 42, and as a result, the base current of $Q_1$ is increased. That is, the collector current of $Q_1$ is quickly increased according to the positive feedback operation so that $Q_1$ becomes conductive. The reactor 41, however, is a non-linear type having a saturable characteristic, so that as the collector current increases, the value of the flux change $d\phi/dt$ becomes smaller, the induced voltage in the coil 42 becomes lower, and the collector current of $Q_1$ is gradually reduced and $Q_1$ finally becomes non-conductive.

At this point, since the collector current does not flow, the flux level of the magnetic core 41 returns to the original flux level. By periodically repeating the above cycle, magnetic oscillation is generated. Further, the definition of the flux level of the magnetic core 41 by the external magnetic field $H_{ex}$ is by the ratio between the conducting period and the non-conducting period of the transistor $Q_1$.

Figure 5B:
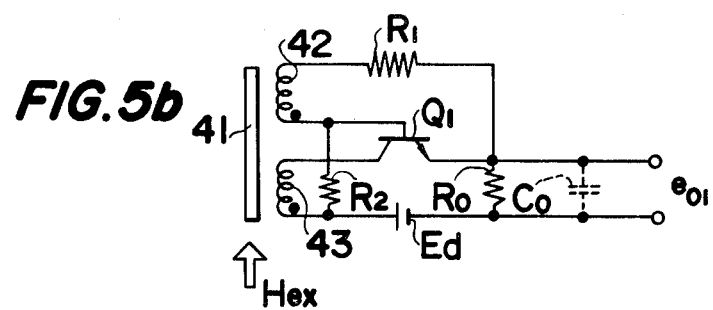
Figure 5C:
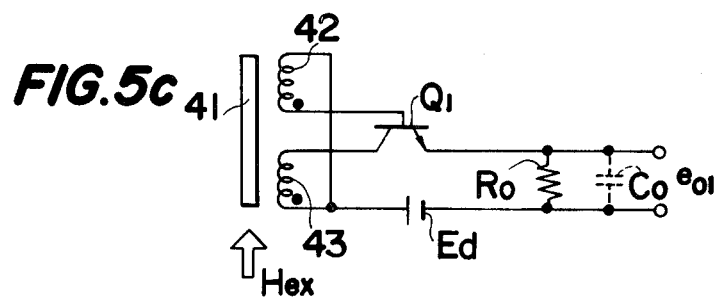

FIGS. 5b and 5c show modified circuits similar to that of FIG. 5a. Magnetic oscillation in FIGS. 5b to 5c is generated by a switching operation of the reactor and the transistor, which oscillatory operation is the same as described in the foregoing so that the details are omitted.

Figure 5D:
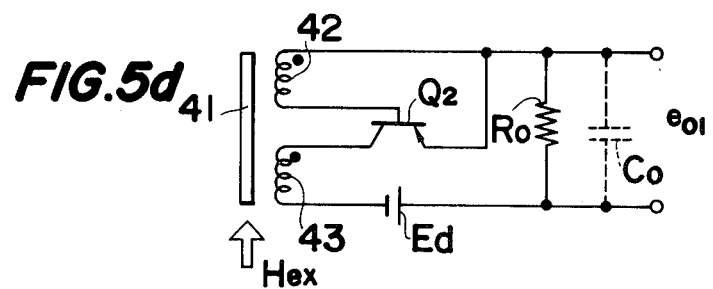

FIG. 5d shows a modified circuit using a PNP type transistor $Q_2$. In this modification a resistor $R_2$ normally inserted between the negative terminal of the supply source Ed and the base of the transistor $Q_2$ is omitted since this circuit is also oscillated in the absence of the resistor $R_2$. This oscillatory operation is the same as described in the foregoing.

Figure 6A:
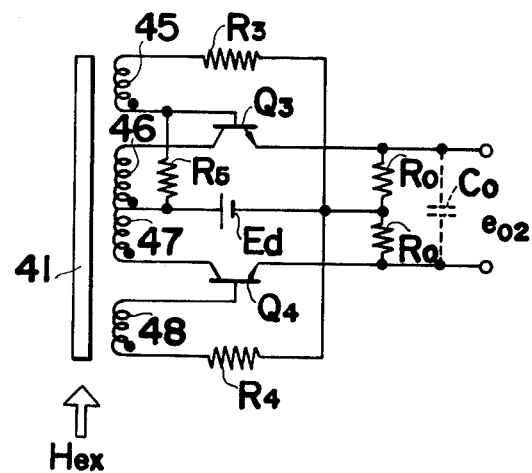
FIGS. 6a and 6b are circuit diagrams showing further circuit arrangements of the magnetometer.
Figure 6B:
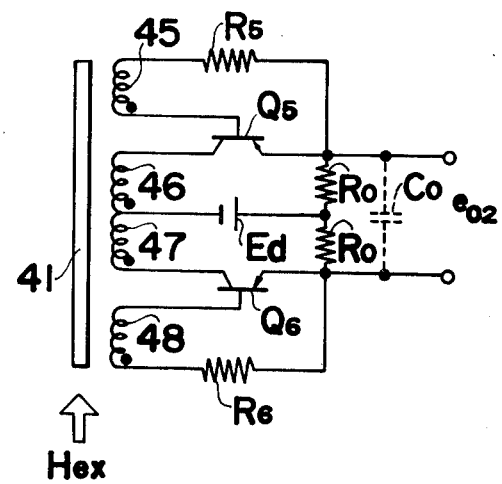

FIGS. 6a and 6b show a magnetic multivibrator type magnetometer consisting of a magnetic core, two transistors, four windings or coils and a direct current supply source Ed. FIG. 6a is an embodiment using NPN type transistors $Q_3$ and $Q_4$. The oscillatory operation in this circuit is as follows.

At first, when the voltage of the supply source Ed is applied to the transistor $Q_3$, the current flows through the elements Ed $\oplus \to R_5 \to Q_3 \to R_0 \to$ Ed $\ominus$. The collector current of $Q_3$ begins to flow to the coil 46 through the resistor $R_0$ and the voltage is induced in the coil 45. This induced voltage increases the collector current of $Q_3$ since the polarity at the base side of the voltage is $\oplus$ and at the emitter side the polarity is $\ominus$. Therefore, the transistor $Q_3$ becomes conducting. On the other hand, in $Q_4$ the voltage induced in the coil 48 by said collector current is $\ominus$ at the base side and $\oplus$ at the emitter side, so that $Q_4$ becomes non-conducting. During the period when such condition is continued for some time, because of the non-linear characteristic of the magnet core 41, the value of $d\phi/dt$ in the reactor 41 becomes smaller and zero in the end as described in the explanation of FIG. 5a. Then, the voltage induced in the coil 45 becomes zero, and as a result, the collector current of $Q_3$ is reduced and the flux level of the reactor 1 tries to return the flux level defined by the external magnetic field $H_{ex}$, so that the induced voltage having a transverse polarity is generated in the coil 48, $Q_4$ becomes $\oplus$ at the base side and $\ominus$ at the emitter side, the collector current of $Q_4$ flows to the coil 47 through the resistor $R_0$ and as a result, the transistor $Q_4$ becomes conducting. Therefore, by induced voltage generated in the coil 45 $Q_3$ becomes the non-conducting. Such operation is repeated to generate magnetic oscillation. FIG. 6b is a modified circuit similar to that of FIG. 6a and uses two PNP type transistors which corresponds to the configuration formed by using two of the circuit shown in FIG. 5d.

As is apparent from the above explanation, according to the present invention, the magnetic sensor is constructed by the inner core body 1 of the sensor and the magnetic field sensing member 2 of the magnetometer, the permanent magnet exciter 3 and the driving circuit 4, so that when this sensor is embedded in the shaft furnace wall, with the drop of the charge in the shaft furnace around the top end, the exciting magnetic field generated from the permanent magnet exciter 3 is disturbed and the exciting magnetic field vector component in the axial of the magnetic field detection in the magnetic field sensing member 2 is changed, and as a result, the behavior of the charge can precisely be measured.

In addition, if two magnetic field sensing members 2 are arranged at both ends of the permanent magnet exciter 3, i.e., the other end portion of the inner core body 1 and the other portion of the driving circuit 4, and these two magnetic field sensing members 2 are driven by one driving circuit 4, the same effect can be achieved, so that by removing a parallel magnetic field component applied from the periphery, the behaviors of only the charge in the shaft furnace near the furnace wall can be detected by the magnetic field sensing member 2 arranged at the other end of the inner core body.

Further, when a plurality of the magnetic field sensing members 2 are provided at the outer end, their angles at which they are mounted can be optionally be selected. Therefore, a plurality of different signals can be measured at the same time at the same measuring point.

For example, two magnetic field sensing members can be provided in parallel and orthogonal to the center axis of the exciter, or two parallel magnetic field sensing members can be arranged in differential relationship, thereby achieving the above effect.

Further, according to the present invention, the inner and outer casings 5 and 7 enclose the inner core body 1, and a cooling medium is supplied to the space 6 between these casings 5 and 7 so as to achieve cooling, and as a result, even if the sensor according to the present invention is embedded in the shaft furnace wall, the working condition is not affected by furnace heat, and measurement does not become out of order but remains stable.

The present invention is not limited to use with the above described shaft furnace, but can be utilized in many industrial fields, such as in storage tanks, raw material cutting hoppers, chemical reaction tanks, etc., and in such cases, the present invention can be used in the same way as with the shaft furnace.

What is claimed is:

1. A magnetic field sensor structure comprising an outer casing having a cooling medium injecting pipe with a flow control valve therein and a cooling medium exhaust pipe with a flow control valve therein, a flange on the outer peripheral surface of the outer casing at a predetermined position along the outer casing in one direction from the injecting pipe and the exhaust pipe, a sensor comprising an inner core body consisting of a permanent magnet exciter for magnetizing and exciting a charge in a shaft furnace or the like, a magnetic field sensing member positioned along the inner core body adjacent one end of the exciter for detecting the exciting magnetic field generated from said exciter the magnetic field sensing member being on the same side of the exciter as the flange is positioned in relation to the pipes, and a driving circuit positioned along the inner core body adjacent the other end of the exciter for driving said magnetic field sensing member, and an inner casing in which the inner core body is contained, said inner casing being positioned in said outer casing and spaced from the interior surface of said outer casing for providing a space for circulating a cooling medium through the space to cool the inner core body.

2. A magnetic field sensor as claimed in claim 1, wherein said magnetic field sensing member consists of a magnetic oscillation type magnetometer comprising a magnetic core, two windings wound on the core, one transistor having the electrodes connected to the windings, and a D.C. supply source connected between the transistor and the windings.

3. A magnetic field sensor as claimed in claim 2, wherein said magnetic oscillation type magnetometer comprises one magnetic core, four windings wound on the core, two transistors having the electrodes connected to the windings, and a D.C. supply source connected between the transistors and the windings.

4. A magnetic field sensor as claimed in claim 1, further comprising temperature detecting elements in the injecting pipe and the exhaust pipe of the outer casing for detecting the temperature of the cooling medium at the inlet to and exhaust from said space.

* * * * *